(12) United States Patent
Mizusaki et al.

(10) Patent No.: US 8,624,585 B2
(45) Date of Patent: Jan. 7, 2014

(54) PROXIMITY SENSOR

(75) Inventors: Hiroyuki Mizusaki, Fukuchiyama (JP);
Daisuke Inoue, Ayabe (JP); Susumu Kutsuhara, Kyoto (JP)

(73) Assignee: OMRON Corporation, Kyoto (JP)

( * ) Notice: Subject to any disclaimer, the term of this patent is extended or adjusted under 35 U.S.C. 154(b) by 403 days.

(21) Appl. No.: 13/019,771

(22) Filed: Feb. 2, 2011

(65) Prior Publication Data

US 2011/0187353 A1 Aug. 4, 2011

(30) Foreign Application Priority Data

Feb. 4, 2010 (JP) .................................. 2010-023004

(51) Int. Cl.
*G01B 7/14* (2006.01)

(52) U.S. Cl.
USPC ...................... 324/207.11; 29/595; 340/815.4

(58) Field of Classification Search
None
See application file for complete search history.

(56) References Cited

U.S. PATENT DOCUMENTS

| | | | | |
|---|---|---|---|---|
| 6,025,820 | A * | 2/2000 | Salmon et al. .................. | 362/23 |
| 6,127,910 | A * | 10/2000 | Webb et al. ..................... | 335/205 |
| 2006/0059056 | A1 | 3/2006 | Tsuchida et al. | |
| 2007/0216797 | A1 | 9/2007 | Yoshida et al. | |
| 2008/0285256 | A1* | 11/2008 | Mezouari et al. ............... | 362/23 |

FOREIGN PATENT DOCUMENTS

| | | |
|---|---|---|
| CN | 1328638 A | 12/2001 |
| CN | 1459119 A | 11/2003 |
| CN | 2791451 Y | 6/2006 |
| CN | 1967044 A | 5/2007 |
| CN | 101030013 A | 9/2007 |
| JP | 60-174155 U | 11/1985 |
| JP | 60-174156 U | 11/1985 |
| JP | 3-049123 A | 3/1991 |
| JP | 11-312446 A | 11/1999 |
| JP | 2007-035583 A | 2/2007 |
| JP | 2008281250 A | * 11/2008 |
| WO | 00/13003 A1 | 3/2000 |

OTHER PUBLICATIONS

Machine English translation of Japanese Patent Application Publication to Inventor Yogo Motoo. JP 2007-035583 A, Feb. 8, 2007. Translation of pp. 2-12 created on May 4, 2013.*
Machine English translation of Japanese Patent Application Publication to Inventor Hideki Yoshikawa. JP 2008-281250 A, Nov. 20, 2008. Translation of pp. 2-10 created on May 5, 2013.*

(Continued)

*Primary Examiner* — Melissa Koval
*Assistant Examiner* — Stephen G Armstrong
(74) *Attorney, Agent, or Firm* — Osha Liang LLP

(57) ABSTRACT

A proximity sensor includes a circuit board provided with a processing circuit, a light emitting device mounted on the surface of the circuit board, and a light-transmitting cylindrical light guide surrounding the portion of the circuit board having the light emitting device mounted thereon and guiding the outgoing light from the light emitting device to be emitted to outside. The cylindrical light guide includes the first light emitting surface as the first light outgoing region causing the light emitted from the light emitting device to pass therethrough and directly emitting the light to outside, a reflective surface reflecting the light emitted from the light emitting device to guide the light through the cylindrical light guide in the circumferential direction, and the second light emitting surface as the second light outgoing region emitting, to outside, the light reflected on the reflective surface and propagated through the cylindrical light guide.

13 Claims, 13 Drawing Sheets

(56) References Cited

OTHER PUBLICATIONS

Patent Abstracts of Japan, Publication No. 11-312446, Publication Date: Nov. 9, 1999, 1 page.
Patent Abstracts of Japan, Publication No. 2007-035583, Publication Date: Feb. 8, 2007, 1 page.
Chinese Office Action issued in Application No. 201110035617.3, dated Feb. 28, 2013, and translation thereof (21 pages).
Japanese Notice of Allowance issued in Application No. 2010-023004, dated Apr. 2, 2013, and translation thereof (6 pages).

* cited by examiner

PROXIMITY SENSOR

BACKGROUND

1. Technical Field

The present invention relates to a proximity sensor using a magnetic field to detect the presence or absence of a metal body as an object to be detected or to detect the position of the metal body.

2. Related Art

A proximity sensor using a magnetic field is known as one of sensors detecting the presence or absence of a metal body as an object to be detected or detecting the position of the metal body. This proximity sensor is widely utilized mainly for various production facilities, industrial robots and the like.

The proximity sensor mainly includes a cylindrical housing, a coil assembly having a core and a detecting coil, and a circuit board provided with a processing circuit electrically connected to the detecting coil. The coil assembly is disposed at the front end within the housing. In addition, at least a part of the circuit board provided with the processing circuit is disposed behind the coil assembly within the housing.

In recent years, the proximity sensor is often provided with a light emitting device as an indicator light. This light emitting device as an indicator light includes, for example, a device turning on/off the light in accordance with turning on/off of the power supply, a device turning on/off the light in accordance with the detection state of the metal body, a device turning on/off the light in order to inform the user of the information used for making various settings when the proximity sensor is installed, and the like.

When used in any of the above-described cases, the light emitting device as an indicator light is generally mounted on one of the main surfaces of the circuit board provided with the processing circuit as described above. For example, Japanese Patent Laying-Open No. 11-312446, Japanese Patent Laying-Open No. 2007-35583 and the like disclose a proximity sensor in which a light emitting device as an indicator light is mounted on one of the main surfaces of the circuit board.

SUMMARY

In accordance with one aspect of the present invention, the sensor serves to detect presence or absence of a metal body or a position of the metal body using a magnetic field. The proximity sensor includes a housing, a detecting coil, a circuit board, a light emitting device, and a cylindrical light guide. The housing is made of a light-blocking member having an elongated cylindrical shape and including a frond end and a rear end in an axial direction. The detecting coil is located at the front end within the housing. The circuit board is made of a member in a shape of a flat plate and disposed behind the detecting coil so as to extend along the axial direction of the housing. The circuit board is provided with a processing circuit electrically connected to the detecting coil. The light emitting device is mounted on one of main surfaces of the circuit board and emits light in accordance with an operation state of the proximity sensor. The cylindrical light guide is a light-transmitting member surrounding, along a circumferential direction of the housing, a portion of the circuit board having the light emitting device mounted thereon and guiding outgoing light from the light emitting device to be emitted to outside. The cylindrical light guide includes a first light outgoing region causing the light emitted from the light emitting device to pass therethrough and directly emitting the light to outside, a reflective surface reflecting the light emitted from the light emitting device to guide the light through the cylindrical light guide in the circumferential direction, and a second light outgoing region emitting, to outside, the light reflected on the reflective surface and propagated through the cylindrical light guide.

In an embodiment of the proximity sensor according to the present invention, it is preferable that the first light outgoing region is provided in a portion of an outer circumferential surface of the cylindrical light guide covering the one of the main surfaces of the circuit board on which the light emitting device is mounted. In this case, it is preferable that the second light outgoing region is provided in a portion of the outer circumferential surface of the cylindrical light guide blocked by the circuit board as seen from the light emitting device.

In an embodiment of the proximity sensor according to the present invention, the reflective surface may be formed by providing a flat region in an outer circumferential surface of the cylindrical light guide or may be formed by providing a V-shaped groove in cross section in an outer circumferential surface of the cylindrical light guide. Furthermore, in the proximity sensor according to the present invention, the reflective surface may be formed by providing a hollow within the cylindrical light guide.

In an embodiment of the proximity sensor according to the present invention, the cylindrical light guide may further include a refractive surface refracting the light emitted from the light emitting device to guide the light through the cylindrical light guide in the circumferential direction. In this case, the refractive surface may be formed by providing a flat region in an inner circumferential surface of the cylindrical light guide or may be formed by providing a V-shaped groove in cross section in an inner circumferential surface of the cylindrical light guide.

In an embodiment of the proximity sensor according to the present invention, the first light outgoing region and the second light outgoing region each may be formed by providing a flat region in an outer circumferential surface of the cylindrical light guide or each may be formed by providing a V-shaped groove in cross section in an outer circumferential surface of the cylindrical light guide.

In an embodiment of the proximity sensor according to the present invention, the cylindrical light guide may be exposed at a position rearwardly of the rear end of the housing.

In an embodiment of the proximity sensor according to the present invention, the cylindrical light guide may be covered by the housing. In this case, a window for exposing each of the first light outgoing region and the second light outgoing region is provided in a portion of the housing corresponding to each of the first light outgoing region and the second light outgoing region provided in the cylindrical light guide.

It is preferable that an embodiment of the proximity sensor according to the present invention further includes a light-transmitting resin sealing layer filling a space within the cylindrical light guide. In this case, it is preferable that the light emitting device is sealed in the resin sealing layer.

An embodiment of the proximity sensor according to the present invention may include a fixing member supporting the circuit board and fixing the circuit board to the housing by at least a part of the fixing member attached to the rear end of the housing. In this case, it is preferable that the cylindrical light guide is formed of a part of the fixing member.

The foregoing and other objects, features, aspects and advantages of the present invention will become more apparent from the following detailed description of the present invention when taken in conjunction with the accompanying drawings.

DETAILED DESCRIPTION

The embodiments of the present invention will be hereinafter described in detail with reference to drawings. It is to be noted that the proximity sensor in the first embodiment described below has a connection to the outside made by cords, and the proximity sensor in the second embodiment described below has a connection to the outside made by terminal pins.

First Embodiment

Figure 1:
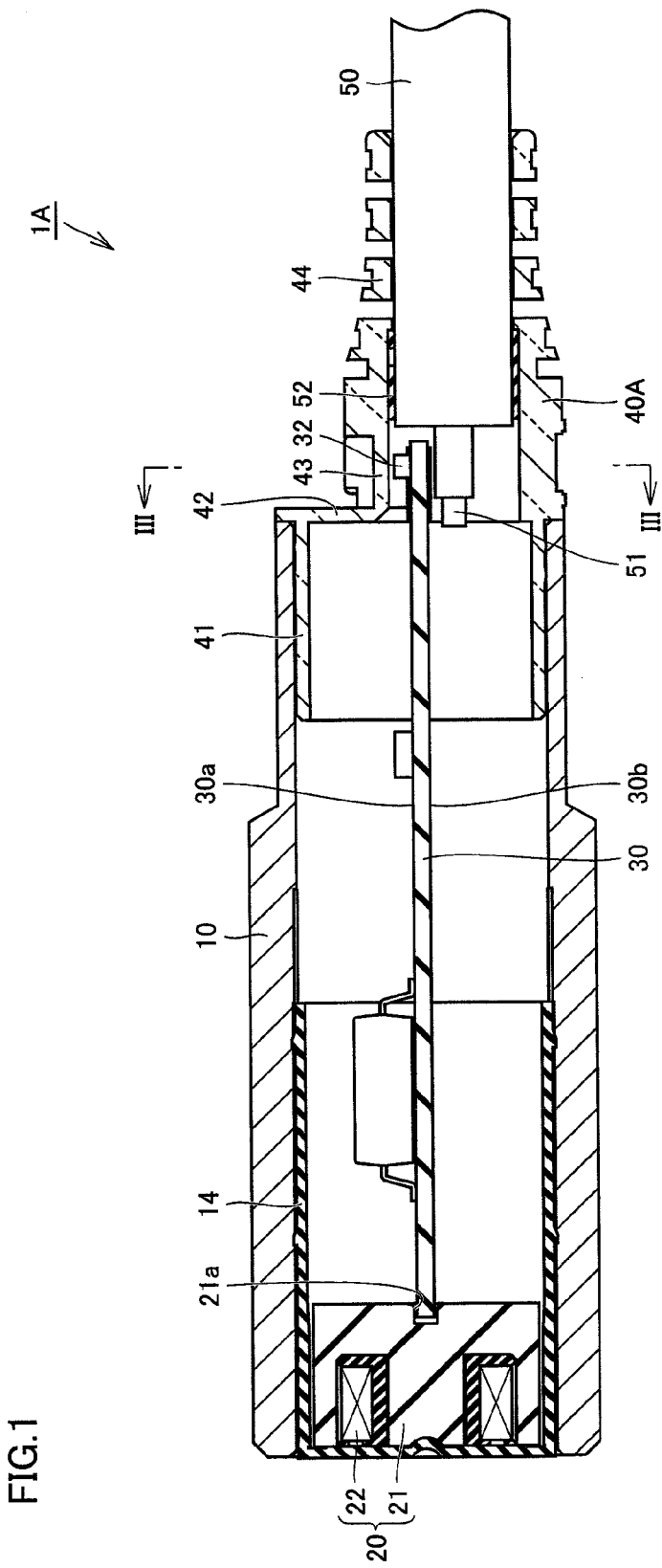
FIG. 1 is a schematic cross sectional view showing the internal structure of a proximity sensor in the first embodiment according to the present invention.
Figure 2:
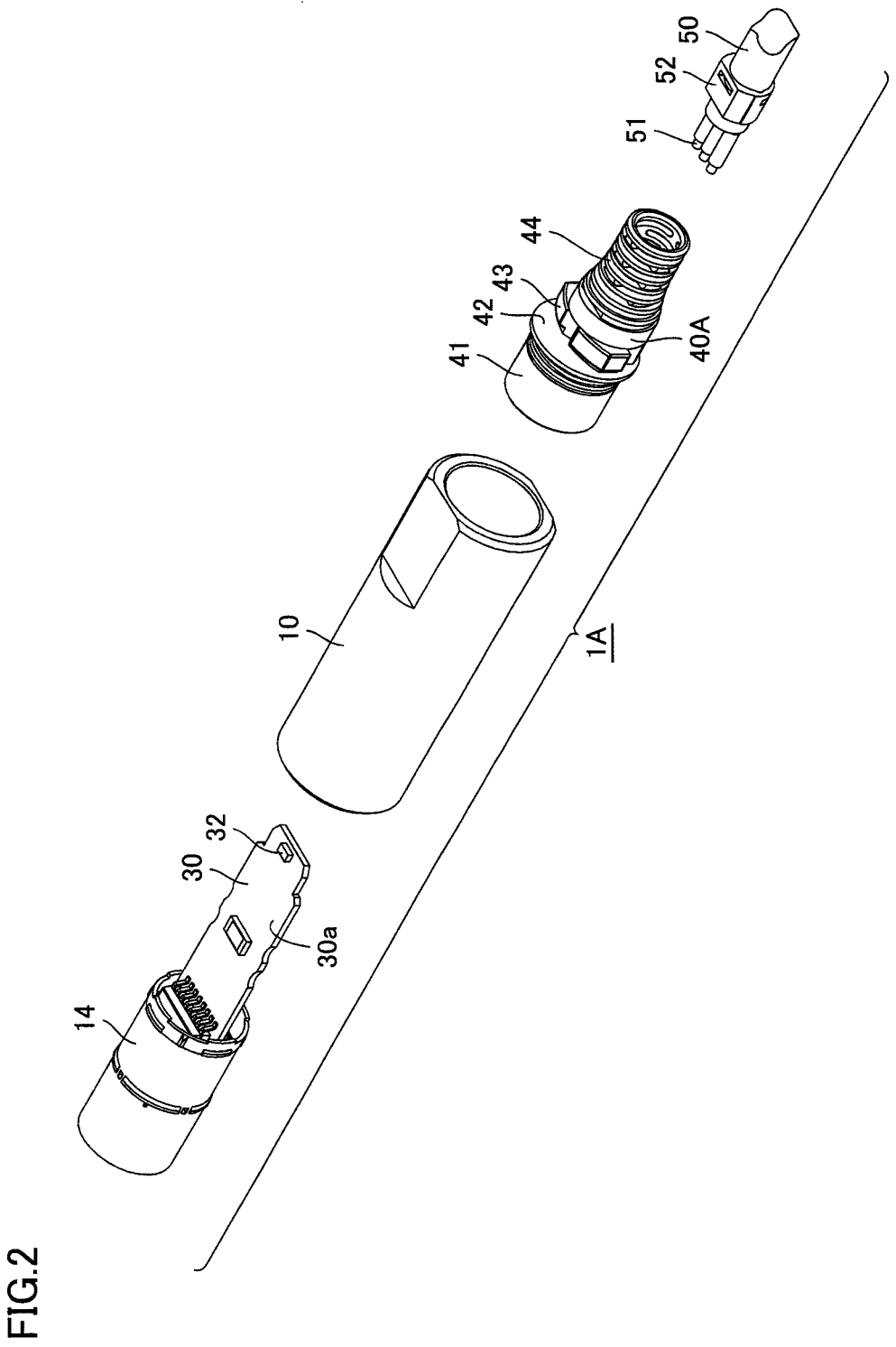
FIG. 2 is an exploded perspective view showing the assembly structure of the proximity sensor shown in FIG. 1.

FIG. 1 is a schematic cross sectional view showing the internal structure of the proximity sensor in the first embodiment of the present invention. FIG. 2 is an exploded perspective view showing the assembly structure of the proximity sensor shown in FIG. 1. First, referring to these FIGS. 1 and 2, the structure of the proximity sensor in the present embodiment will be described.

As shown in FIGS. 1 and 2, a proximity sensor 1A according to the present embodiment has an approximately cylindrical outer shape and mainly includes a case body 10 as a housing, a coil assembly 20, a circuit board 30, a holder 40A as a fixing member, and a cord 50.

Case body 10 is formed of an elongated cylindrical member which is made of metal and has both ends opened. Case body 10 has a front end and a rear end in the axial direction. Coil assembly 20 is attached to the front end of case body 10, and holder 40A is attached to the rear end of case body 10. In addition, case body 10 has a light blocking effect which prevents light from passing therethrough.

Coil assembly 20 includes a core 21 and a detecting coil 22. Core 21 is formed of a short cylindrical member made of magnetic materials. Detecting coil 22 is formed in an approximately cylindrical shape, for example, by winding the lead wire therearound and housed in the annular recess provided in core 21. It is to be noted that core 21 has a rear face provided with a support groove 21a for supporting the edge of circuit board 30.

Coil assembly 20 is housed within a coil case 14 made of a cylindrical insulating member having a bottom in such a manner that the front face of core 21 is in contact with the bottom of coil case 14. Coil case 14 is fixedly press-fitted into case body 10 such that the bottom of coil case 14 is located at the front end of case body 10.

Circuit board 30 is made of a rigid wiring board in the shape of a flat plate and disposed behind coil assembly 20 so as to extend along the axial direction of case body 10. Circuit board 30 has a surface 30a corresponding to one main surface and a rear surface 30b corresponding to the other main surface. Each of surface 30a and rear surface 30b is provided with a conductor pattern. It is to be noted that a rigid wiring board is a circuit board having high rigidity which is represented by a glass-epoxy board and particularly suitable for mounting electronic components thereon.

Circuit board 30 has various processing circuits formed thereon. The processing circuit includes an oscillation circuit having detecting coil 22 as a resonant circuit element, and a discrimination circuit comparing the oscillation amplitude of the oscillation circuit with a threshold value for binarization. Furthermore, circuit board 30 is also provided with an output circuit converting the output of the discrimination circuit into a voltage output or a current output in a predetermined form, and a power supply circuit converting the electric power introduced from outside into power in a predetermined power supply form for outputting the electric power. In addition, circuit board 30 is also provided with a light emitting device driving circuit which controls driving of a light emitting device 32 which will be described later. These various types of circuits each are formed of the above-described conductor pattern provided in circuit board 30 and the electronic components mounted on surface 30a of circuit board 30.

Light emitting device 32 is mounted on a portion of surface 30a of circuit board 30 located outside of case body 10. Light emitting device 32 is driven by the above-described light emitting device driving circuit and emits light in accordance with the operation state of proximity sensor 1A. Light emitting device 32 is formed of an LED (Light Emitting Diode), for example.

In addition, a core wire 51 of cord 50 is bonded by solder (not shown) to a portion of rear surface 30b of circuit board 30 located outside of case body 10. Cord 50 serves as a connection for electrically connecting the above-described output circuit and power supply circuit to the outside. An adapter 52 for preventing disengagement is attached in the vicinity of the end of cord 50. Adapter 52 is brought into contact with the stop face provided in a cord retainer 44 of holder 40A which will be described later, so that cord 50 is prevented from falling off.

Holder 40A having an approximately cylindrical shape is formed by injection molding of a light-transmitting resin material. Holder 40A serves as a member for fixing circuit board 30 to case body 10 and includes a fixed portion 41, a closing portion 42, a cylindrical light guide 43, and cord retainer 44. Fixed portion 41 having a cylindrical shape is fixed to the rear end of case body 10. Closing portion 42 is in the shape of a flat plate and serves to close the opening located at the rear end of case body 10. Cylindrical light guide 43 having an approximately cylindrical shape surrounds, along the circumferential direction of case body 10, a portion of circuit board 30 having light emitting device 32 mounted thereon. Cord retainer 44 having an approximately cylindrical shape serves to retain inserted cord 50. In addition, cord retainer 44 has an inner circumferential surface which is provided in its predetermined position with a stop face for preventing cord 50 from falling off.

Fixed portion 41 which is a part of holder 40A is press-fitted into the opening located at the rear end of case body 10, so that holder 40A is fixed to case body 10. Accordingly, closing portion 42, cylindrical light guide 43 and cord retainer 44 of holder 40A each are exposed to the outside at the position behind the rear end of case body 10.

In this case, in the predetermined position of the inner circumferential surface of each of fixed portion 41 and cylindrical light guide 43 of holder 40A, a support groove 48 (see FIG. 3 and the like) is provided for supporting both side ends located in the short-side direction of circuit board 30. Accordingly, circuit board 30 is fixed to case body 10 by the configuration in which the front end of circuit board 30 is supported by support groove 21a provided in the rear face of the above-described core 21 and both side ends at the rear end of circuit board 30 are supported by the above-described support groove 48 provided in holder 40A.

Figure 3:
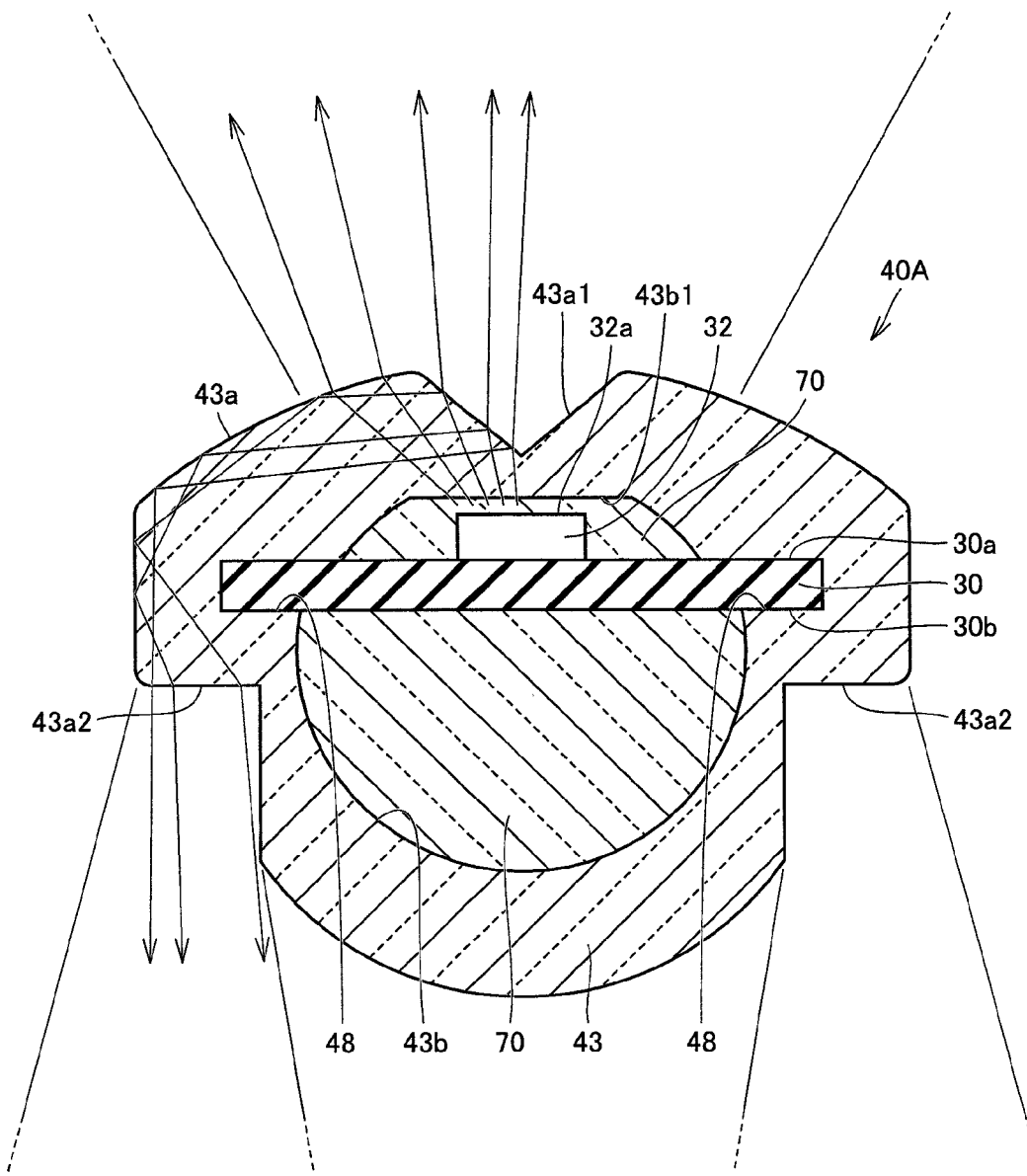
FIG. 3 is a schematic cross sectional view showing the shape of a cylindrical light guide of the proximity sensor shown in FIG. 1.

It is to be noted that the space within each of case body 10 and holder 40A is sealed by filling the space with a resin sealing layer 70 (not shown in FIG. 1, but see FIG. 3 and the like). Resin sealing layer 70 serves to air-tightly and water-tightly seal the space within each of case body 10 and holder 40A against the outside while protecting various components (circuit board 30, and various electronic components, wiring members and the like mounted on circuit board 30) incorporated into case body 10 and holder 40A. In addition, resin sealing layer 70 is formed by injecting and curing liquid resin. While resin materials such as an epoxy resin, for example, are suitably used for this resin sealing layer 70, at least a portion of the resin sealing layer located within cylindrical light guide 43 of holder 40A should be formed by a light-transmitting resin material or a thin-film sealing resin layer.

FIG. 3 is a cross sectional view of the proximity sensor taken along a line III-III shown in FIG. 1 and also is a schematic cross sectional view showing the shape of the cylindrical light guide of the holder as a fixing member. Then, referring to FIG. 3, described in detail will be the shape of the cylindrical light guide and a light path of the outgoing light of the light emitting device guided in the cylindrical light guide. Although only a part of the outgoing light from the light emitting device is shown in FIG. 3 for ease of understanding, light is actually radially emitted from the light emitting device.

As shown in FIG. 3, cylindrical light guide 43 of holder 40A has an approximately cylindrical shape and includes an outer circumferential surface 43a and an inner circumferential surface 43b. In the predetermined position of inner circumferential surface 43b of cylindrical light guide 43, a pair of support grooves 48 for supporting the above-described circuit board 30 is provided. The pair of support grooves 48 supports both side ends of circuit board 30 to support circuit board 30 with holder 40A. Light emitting device 32 is mounted on a portion of surface 30a of circuit board 30 surrounded by cylindrical light guide 43 of holder 40A. Furthermore, the space within cylindrical light guide 43 is filled with light-transmitting resin sealing layer 70, so that light emitting device 32 is sealed in resin sealing layer 70. In this case, it is preferably that resin sealing layer 70 is lower in refractive index than the material forming cylindrical light guide 43. When resin sealing layer 70 is lower in refractive index than the material forming cylindrical light guide 43, the effect of confining the light within cylindrical light guide 43 is remarkably improved, which causes an increase in the amount of the light emitted from the second light emitting surface as the second light outgoing region which will be described later. Consequently, the indication state of light emitting device 32 can be observed from outside with good visibility.

In a portion of inner circumferential surface 43b of cylindrical light guide 43 located above a light outgoing surface 32a of light emitting device 32, a flat region is provided, to thereby form a refractive surface 43b1. Furthermore, in a portion of outer circumferential surface 43a of cylindrical light guide 43 located above light emitting device 32, a V-shaped groove in cross section is formed, so that a pair of flat regions is provided which is arranged at an angle with respect to each other. This leads to formation of a pair of reflective surfaces 43a1. Refractive surface 43b1 and the pair of reflective surfaces 43a1 serve to refract and reflect a part of the light emitted from light outgoing surface 32a of light emitting device 32 in the circumferential direction within cylindrical light guide 43. These surfaces each are provided in a portion of cylindrical light guide 43 covering surface 30a of circuit board 30 having light emitting device 32 mounted thereon.

In addition, the portion of outer circumferential surface 43a of cylindrical light guide 43 covering surface 30a of circuit board 30 having light emitting device 32 mounted thereon entirely serves as the first light emitting surface as the first light outgoing region. This first light emitting surface serves to emit the light to the outside when a part of the light emitted from light emitting device 32 passes through cylindrical light guide 43. In this case, the portion of outer circumferential surface 43a of cylindrical light guide 43 provided with the above-described reflective surface 43a1 is also included in the first light emitting surface. This is because a part of the light applied to reflective surface 43a1 passes also through reflective surface 43a1 without reflection. In FIG. 3, the irradiation range of the above-described first light emitting surface is shown by a pair of thin lines extending from outer circumferential surface 43a in the upward direction in the figure and each having an upper portion of a broken line. In other words, a portion of the surface of cylindrical light guide 43 located between the above-described pair of thin lines roughly shows a portion serving as the first light emitting surface, which will be similarly shown in FIGS. 4, 8, 12, and 13.

Furthermore, in the predetermined position of outer circumferential surface 43a of cylindrical light guide 43 located in the portion blocked by circuit board 30 as seen from light emitting device 32, a V-shaped groove in cross section is formed, so that a pair of flat regions is provided which is arranged at an angle with respect to each other. One of the pair of flat regions provides a second light emitting surface 43a2 as the second light outgoing region. The above-described groove is formed below circuit board 30 and in the vicinity of each of both side ends of circuit board 30, so that two second light emitting surfaces 43a2 are provided which face in the opposite direction to the above-described first light emitting surface. These two second light emitting surfaces 43a2 emit light to the outside when a part of the light emitted from light emitting device 32 is guided by cylindrical light guide 43 and passed through these two second light emitting surfaces 43a2. In FIG. 3, the irradiation range of second light emitting surface 43a2 is shown by a pair of thin lines extending from each of the pair of second light emitting surfaces 43a2 in the downward direction in the figure and each having a lower portion of a broken line, which will be similarly shown in FIGS. 4, 8, 12, and 13.

In proximity sensor 1A according to the present embodiment, a part of the light emitted from light emitting device 32 is refracted and reflected on refractive surface 43b1 and the pair of reflective surfaces 43a1 to cause the light to be guided through cylindrical light guide 43 in the circumferential direction. In some cases, the light is further reflected on outer circumferential surface 43a of cylindrical light guide 43 and thereby collected at the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light.

As described above, according to proximity sensor 1A in the present embodiment, even in the case where only a single light emitting device 32 is mounted on surface 30a of circuit board 30, the light emitted from this single light emitting device 32 can be sufficiently emitted omnidirectionally in the simplified configuration in which only a flat region is provided in each of outer circumferential surface 43a and inner circumferential surface 43b of cylindrical light guide 43 of holder 40A. The above-described flat region can be readily formed during the injection molding of holder 40A, which prevents an increase in the manufacturing cost. Therefore, when the above-described configuration is applied, a proximity sensor manufactured at low cost can be achieved that allows the indication state of light emitting device 32 to be observed from outside with good visibility without the need to mount any light emitting device on rear surface 30b of circuit board 30.

FIGS. 4 to 8 each show a schematic cross sectional view of the shape of the cylindrical light guide of the proximity sensor according to the first to the fifth modifications, respectively, based on the present embodiment. Then, referring to FIGS. 4 to 8, described will be the shape of the cylindrical light guide of the proximity sensor according to the first to fifth modifications based on the present embodiment and a light path of the outgoing light of the light emitting device which is guided in the cylindrical light guide. Although only a part of the outgoing light from the light emitting device is shown in FIGS. 4 to 8 for ease of understanding, the light is actually radially emitted from the light emitting device.

Figure 4:
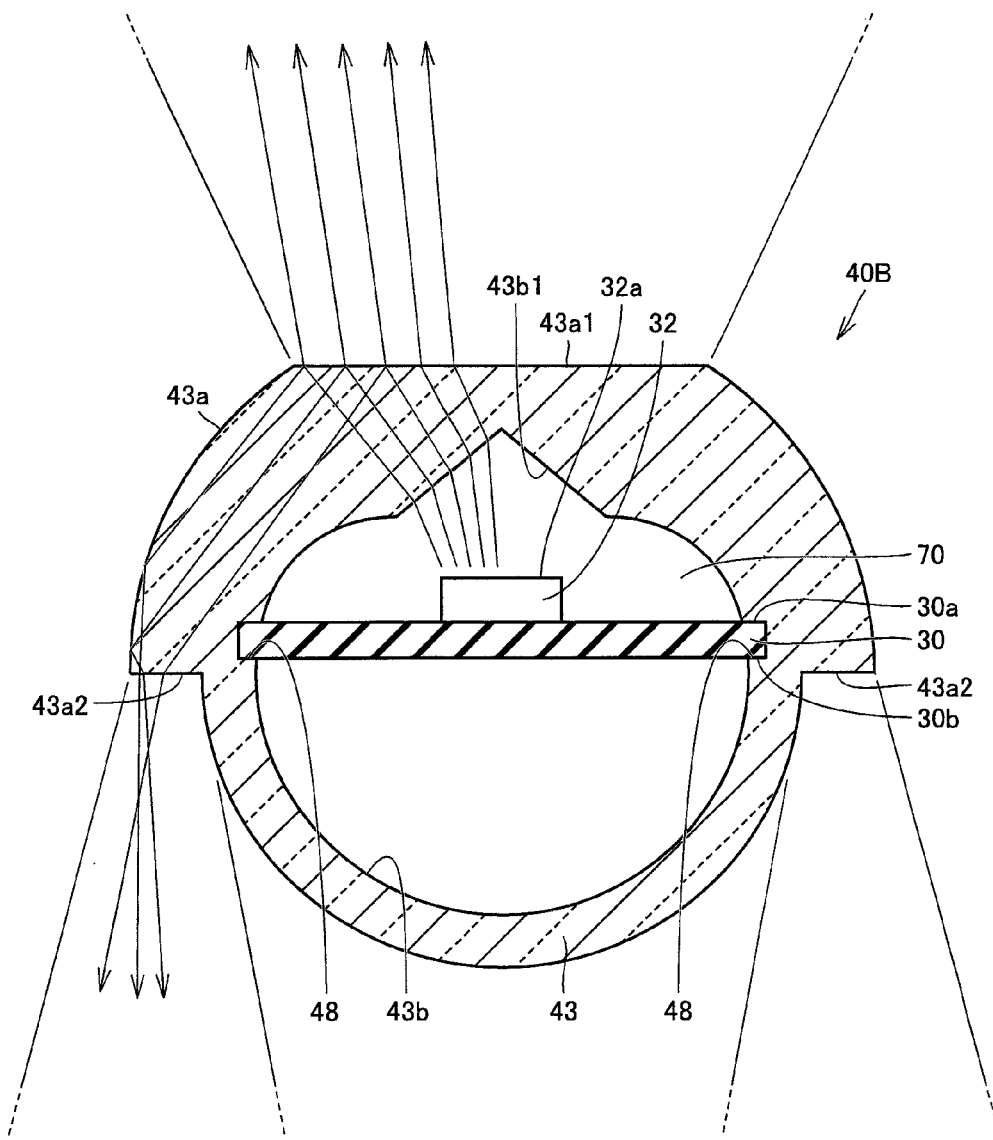
FIG. 4 is a schematic cross sectional view showing the shape of the cylindrical light guide of the proximity sensor according to the first modification of the first embodiment of the present invention.

As shown in FIG. 4, in the proximity sensor according to the first modification, the shape of cylindrical light guide 43 of a holder 40B is different from that of proximity sensor 1A in the above-described present embodiment. Specifically, the shapes of the reflective surface, the refractive surface and the first light emitting surface provided in cylindrical light guide 43 are different while other components are identical in shape. Furthermore, in the proximity sensor according to the first modification, the space within cylindrical light guide 43 is not sealed in the resin sealing layer, but light emitting device 32 mounted on surface 30a of circuit board 30 is exposed within cylindrical light guide 43. Particularly, the differences of the shape of cylindrical light guide 43 will be hereinafter described in detail.

In a portion of inner circumferential surface 43b of cylindrical light guide 43 located above light outgoing surface 32a of light emitting device 32, a V-shaped groove in cross section is formed, so that a pair of flat regions is provided which is arranged at an angle with respect to each other. This leads to formation of a pair of refractive surfaces 43b1. Furthermore, in a portion of outer circumferential surface 43a of cylindrical light guide 43 located above light emitting device 32, a flat region is provided, thereby forming reflective surface 43a1. The pair of refractive surfaces 43b1 and reflective surface 43a1 serve to refract and reflect a part of the light emitted from light outgoing surface 32a of light emitting device 32 in the circumferential direction within cylindrical light guide 43. These surfaces each are provided in a portion of cylindrical light guide 43 covering surface 30a of circuit board 30 having light emitting device 32 mounted thereon. It is to be noted that the portion of outer circumferential surface 43a of cylindrical light guide 43 covering surface 30a of circuit board 30 having light emitting device 32 mounted thereon entirely serves as the first light emitting surface. In addition, the portion of outer circumferential surface 43a of cylindrical light guide 43 provided with the above-described reflective surface 43a1 is also included in the first light emitting surface.

Also in the configuration as described above, a part of the light emitted from light emitting device 32 is refracted and reflected on the pair of refractive surfaces 43b1 and reflective surface 43a1, to cause the light to be guided through cylindrical light guide 43 in the circumferential direction. In some cases, the light is further reflected on outer circumferential surface 43a of cylindrical light guide 43 and thereby collected at each of the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light. Therefore, also in the case where the configuration as in the first modification is applied, the effects can be achieved which are similar to those achieved in the case where proximity sensor 1A in the above-described present embodiment is applied.

Although the first modification employs the configuration in which no resin sealing layer is provided in the space within cylindrical light guide 43, resin sealing layer 70 may be provided within cylindrical light guide 43 (see FIG. 3) as in the case of proximity sensor 1A in the above-described present embodiment. In that case, the amount of light reflected on reflective surface 43a1 can be adjusted by adjusting the refractive index difference between cylindrical light guide 43 and resin sealing layer 70, and thus, the amount of the light emitted from the first light emitting surface and the second light emitting surface can also be adjusted.

Figure 5:
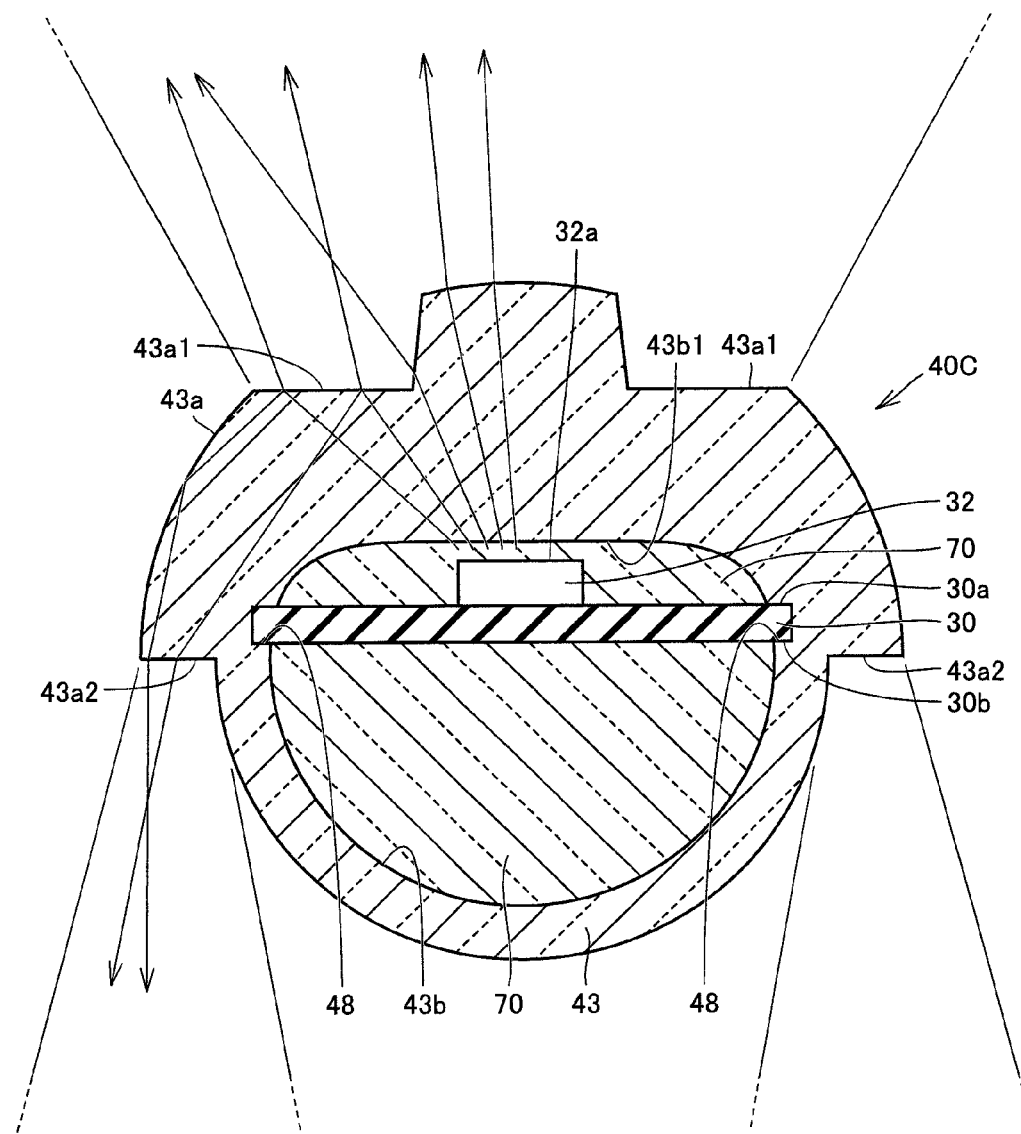
FIG. 5 is a schematic cross sectional view showing the shape of the cylindrical light guide of the proximity sensor according to the second modification of the first embodiment of the present invention.

As shown in FIG. 5, the proximity sensor according to the second modification is different in the shape of cylindrical light guide 43 of a holder 40C from proximity sensor 1A in the above-described present embodiment. Specifically, the shapes of the reflective surface and the first light emitting surface provided in cylindrical light guide 43 are different while other components are identical in shape. Particularly, the differences of the shape of cylindrical light guide 43 will be hereinafter described in detail.

In a portion of inner circumferential surface 43b of cylindrical light guide 43 located above light outgoing surface 32a of light emitting device 32, a flat region is provided to thereby form refractive surface 43b1. Furthermore, in the predetermined position of outer circumferential surface 43a of cylindrical light guide 43 located above light emitting device 32, a V-shaped groove in cross section is formed, so that a pair of flat regions is provided which is arranged at an angle with respect to each other. One of the pair of flat regions provides reflective surface 43a1. The groove described above is provided in each of portions of outer circumferential surface 43a corresponding to both sides of light emitting device 32, which leads to formation of two reflective surfaces 43a1. Refractive surface 43b1 and the pair of reflective surfaces 43a1 serve to refract and reflect a part of the light emitted from light outgoing surface 32a of light emitting device 32 in the circumferential direction within cylindrical light guide 43. These surfaces each are provided in a portion of cylindrical light guide 43 covering surface 30a of circuit board 30 having light emitting device 32 mounted thereon. It is to be noted that the portion of outer circumferential surface 43a of cylindrical light guide 43 covering surface 30a of circuit board 30 having light emitting device 32 mounted thereon entirely serves as the first light emitting surface. In addition, the portion of outer circumferential surface 43a of cylindrical light guide 43 provided with the above-described reflective surface 43a1 is also included in the first light emitting surface.

Also in the configuration as described above, a part of the light emitted from light emitting device 32 is refracted and reflected on refractive surface 43b1 and the pair of reflective surfaces 43a1, to cause the light to be guided through cylindrical light guide 43 in the circumferential direction. In some cases, the light is further reflected on outer circumferential surface 43a of cylindrical light guide 43 and thereby collected at each of the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light. Therefore, also in the case where the configuration as in the second modification is applied, the effects can be achieved which are similar to those achieved in the case where proximity sensor 1A in the above-described present embodiment is applied.

Figure 6:
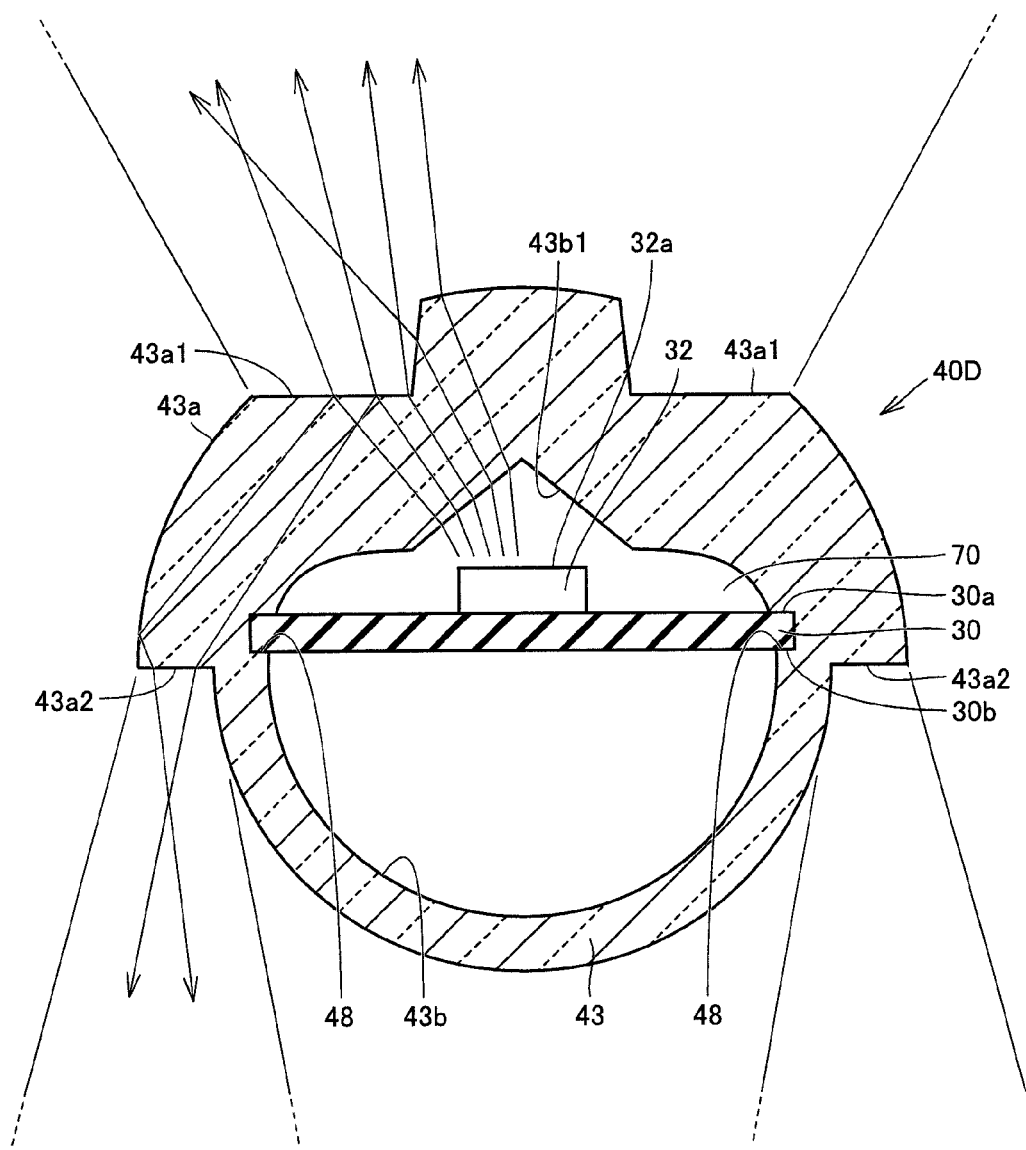
FIG. 6 is a schematic cross sectional view showing the shape of the cylindrical light guide of the proximity sensor according to the third modification of the first embodiment of the present invention.

As shown in FIG. 6, the proximity sensor according to the third modification is different in the shape of cylindrical light guide 43 of a holder 40D from proximity sensor 1A in the above-described present embodiment. Specifically, the shapes of the reflective surface, the refractive surface and the first light emitting surface provided in cylindrical light guide 43 are different while other components are identical in shape. Furthermore, in the proximity sensor according to the third modification, the space within cylindrical light guide 43 is not sealed in the resin sealing layer, but light emitting device 32 mounted on surface 30a of circuit board 30 is exposed within cylindrical light guide 43. Particularly, the differences of the shape of cylindrical light guide 43 will be hereinafter described in detail.

In a portion of inner circumferential surface 43b of cylindrical light guide 43 located above light outgoing surface 32a of light emitting device 32, a V-shaped groove in cross section is formed, so that a pair of flat regions is provided which is arranged at an angle with respect to each other. This leads to formation of a pair of refractive surfaces 43b1. Furthermore, in the predetermined position of outer circumferential surface 43a of cylindrical light guide 43 located above light emitting device 32, a V-shaped groove in cross section is formed, so that a pair of flat regions is provided which is arranged at an angle with respect to each other. One of the pair of flat regions provides reflective surface 43a1. The groove described above is provided in each of portions of outer circumferential surface 43a corresponding to both sides of light emitting device 32, which leads to formation of two reflective surfaces 43a1.

The pair of refractive surfaces 43b1 and the pair of reflective surfaces 43a1 serve to refract and reflect a part of the light emitted from light outgoing surface 32a of light emitting device 32 in the circumferential direction within cylindrical light guide 43. These surfaces each are provided in a portion of cylindrical light guide 43 covering surface 30a of circuit board 30 having light emitting device 32 mounted thereon. It is to be noted that the portion of outer circumferential surface 43a of cylindrical light guide 43 covering surface 30a of circuit board 30 having light emitting device 32 mounted thereon entirely serves as the first light emitting surface. In addition, the portion of outer circumferential surface 43a of cylindrical light guide 43 provided with reflective surface 43a1 described above is also included in the first light emitting surface.

Also in the configuration as described above, a part of the light emitted from light emitting device 32 is refracted and reflected on the pair of refractive surfaces 43b1 and the pair of reflective surfaces 43a1 to cause the light to be guided through cylindrical light guide 43 in the circumferential direction. In some cases, the light is further reflected on outer circumferential surface 43a of cylindrical light guide 43 and thereby efficiently collected at the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light. Therefore, also in the case where the configuration as in the third modification is applied, the effects can be achieved which are similar to those achieved in the case where proximity sensor 1A in the above-described present embodiment is applied.

Although the third modification employs the configuration in which no resin sealing layer is provided in the space within cylindrical light guide 43, resin sealing layer 70 may be provided within cylindrical light guide 43 (see FIG. 3) as in the case of proximity sensor 1A in the above-described present embodiment. In that case, the amount of light reflected on reflective surface 43a1 can be adjusted by adjusting the refractive index difference between cylindrical light guide 43 and resin sealing layer 70, and thus, the amount of light emitted from the first light emitting surface and the second light emitting surface can also be adjusted.

Figure 7:
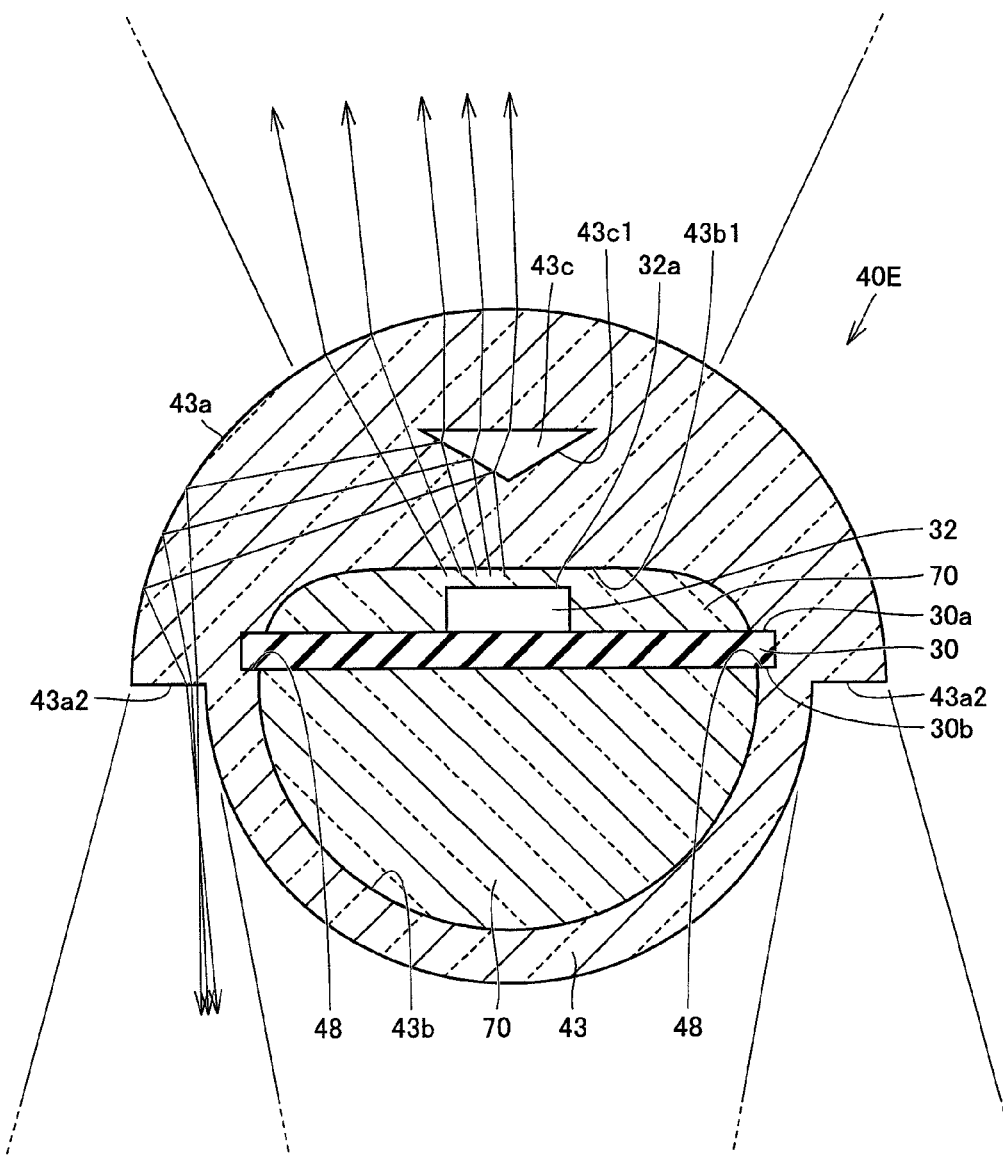
FIG. 7 is a schematic cross sectional view showing the shape of the cylindrical light guide of the proximity sensor according to the fourth modification of the first embodiment of the present invention.

As shown in FIG. 7, the proximity sensor according to the fourth modification is different in the shape of cylindrical light guide 43 of a holder 40E from proximity sensor 1A in the above-described present embodiment. Specifically, the shapes of the reflective surface, the refractive surface and the first light emitting surface provided in cylindrical light guide 43 are different while other components are identical in shape. Particularly, the differences of the shape of cylindrical light guide 43 will be hereinafter described in detail.

In a portion of inner circumferential surface 43b of cylindrical light guide 43 located above light outgoing surface 32a of light emitting device 32, a flat region is provided to thereby form refractive surface 43b1. Furthermore, a portion of cylindrical light guide 43 located above light emitting device 32 is provided with a hollow 43c. Cylindrical light guide 43 has planes defining hollow 43c, one of which is located adjacent to light emitting device 32 and has a V-shaped groove in cross section formed therein, so that a pair of flat regions is provided which is arranged at an angle with respect to each other. This leads to formation of a pair of reflective surfaces 43c1. Refractive surface 43b1 and the pair of reflective surfaces 43c1 serve to refract and reflect a part of the light emitted from light outgoing surface 32a of light emitting device 32 in the circumferential direction within cylindrical light guide 43.

These surfaces each are provided in a portion of cylindrical light guide 43 covering surface 30a of circuit board 30 having light emitting device 32 mounted thereon. It is to be noted that the portion of outer circumferential surface 43a of cylindrical light guide 43 covering surface 30a of circuit board 30 having light emitting device 32 mounted thereon entirely serves as the first light emitting surface.

Also in the configuration as described above, a part of the light emitted from light emitting device 32 is refracted and reflected on refractive surface 43b1 and the pair of reflective surfaces 43c1, to cause the light to be guided through cylindrical light guide 43 in the circumferential direction. In some cases, the light is further reflected on outer circumferential surface 43a of cylindrical light guide 43 and thereby collected at the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light. Therefore, also in the case where the configuration as in the fourth modification is applied, the effects can be achieved which are similar to those achieved in the case where proximity sensor 1A in the above-described present embodiment is applied.

Figure 8:
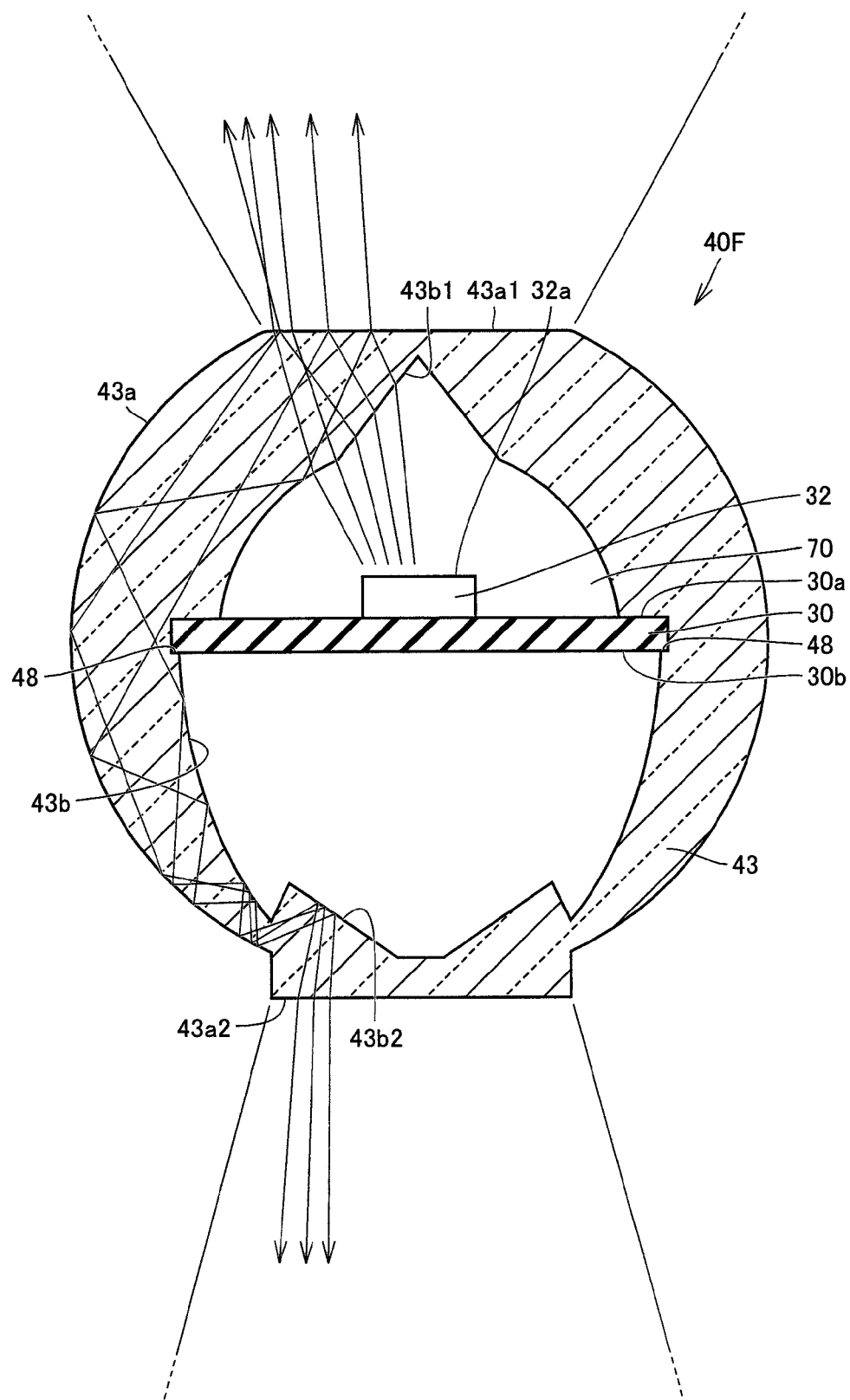
FIG. 8 is a schematic cross sectional view showing the shape of the cylindrical light guide of the proximity sensor according to the fifth modification of the first embodiment of the present invention.

As shown in FIG. 8, the proximity sensor according to the fifth modification is different in the shape of cylindrical light guide 43 of a holder 40F from proximity sensor 1A in the above-described present embodiment. Specifically, the shapes of the reflective surface, the refractive surface, the first light emitting surface, and the second light emitting surface provided in cylindrical light guide 43 are different while other components are identical in shape. Furthermore, in the proximity sensor according to the fifth modification, the space within cylindrical light guide 43 is not sealed in the resin sealing layer, but light emitting device 32 mounted on surface 30a of circuit board 30 is exposed within cylindrical light guide 43. In particular, the differences of the shape of cylindrical light guide 43 will be hereinafter described in detail.

In a portion of inner circumferential surface 43b of cylindrical light guide 43 located above light outgoing surface 32a of light emitting device 32, a V-shaped groove in cross section is formed, so that a pair of flat regions is provided which is arranged at an angle with respect to each other. This leads to formation of a pair of refractive surfaces 43b1. Furthermore, in a portion of outer circumferential surface 43a of cylindrical light guide 43 located above light emitting device 32, a flat region is provided to thereby form reflective surface 43a1. The pair of refractive surfaces 43b1 and reflective surface 43a1 serve to refract and reflect a part of the light emitted from light outgoing surface 32a of light emitting device 32 in the circumferential direction within cylindrical light guide 43. These surfaces each are provided in a portion of cylindrical light guide 43 covering surface 30a of circuit board 30 having light emitting device 32 mounted thereon. It is to be noted that the portion of outer circumferential surface 43a of cylindrical light guide 43 covering surface 30a of circuit board 30 having light emitting device 32 mounted thereon entirely serves as the first light emitting surface. In addition, the portion of outer circumferential surface 43a of cylindrical light guide 43 provided with reflective surface 43a1 described above is also included in the first light emitting surface.

Furthermore, in the predetermined position of inner circumferential surface 43b of cylindrical light guide 43 located in the portion blocked by circuit board 30 as seen from light emitting device 32, a V-shaped groove in cross section is formed, so that a pair of flat regions is provided which is arranged at an angle with respect to each other. One of the pair of flat regions provides a reflective surface 43b2. Two grooves as described above are provided in portions below circuit board 30 having light emitting device 32 mounted thereon, which leads to formation of two reflective surfaces 43b2. Furthermore, in the predetermined position of outer circumferential surface 43a of cylindrical light guide 43 located in the portion blocked by circuit board 30 as seen from light emitting device 32, a flat region is provided to thereby form second light emitting surface 43a2. This second light emitting surface 43a2 is provided in a portion below circuit board 30 having light emitting device 32 mounted thereon. Second light emitting surface 43a2 faces the above-described two reflective surfaces 43b2 while facing in the direction opposite to the above-described first light emitting surface.

Also in the configuration as described above, a part of the light emitted from light emitting device 32 is refracted and reflected on the pair of refractive surfaces 43b1 and reflective surface 43a1, to cause the light to be guided through cylindrical light guide 43 in the circumferential direction. The light is further reflected on outer circumferential surface 43a and inner circumferential surface 43b of cylindrical light guide 43 and thereby collected at the pair of reflective surfaces 43b2. The light is further reflected on each of the pair of reflective surfaces 43b2 and thereby collected at second light emitting surface 43a2. Consequently, most of the light emitted from light emitting device 32 is efficiently collected at second light emitting surface 43a2, with the result that second light emitting surface 43a2 sufficiently emits light. Therefore, also in the case where the configuration as in the fifth modification is applied, the effects can be achieved which are similar to those achieved in the case where proximity sensor 1A in the above-described present embodiment is applied.

Although the fifth modification employs the configuration in which no resin sealing layer is provided in the space within cylindrical light guide 43, resin sealing layer 70 may be provided within cylindrical light guide 43 (see FIG. 3) as in the case of proximity sensor 1A in the above-described present embodiment. In that case, the amount of light reflected on reflective surface 43a1 can be adjusted by adjusting the refractive index difference between cylindrical light guide 43 and resin sealing layer 70, and thus, the amount of light emitted from the first light emitting surface and the second light emitting surface can also be adjusted.

Figure 9:
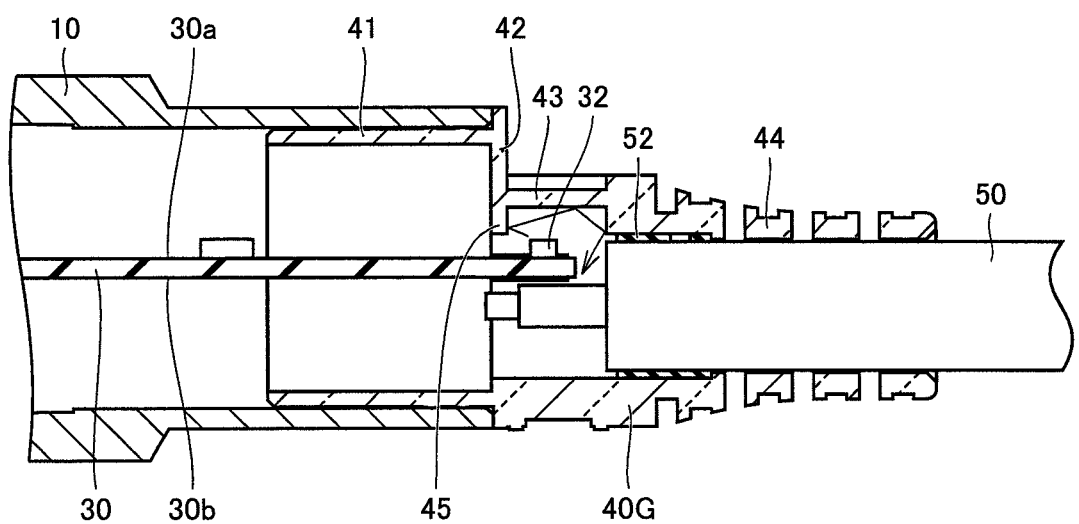
FIG. 9 is a schematic cross sectional view showing the shape of a holder of the proximity sensor according to the sixth modification of the first embodiment of the present invention.

FIG. 9 is a schematic cross sectional view showing the shape of the holder of the proximity sensor according to the sixth modification based on the present embodiment. Then, referring to FIG. 9, described will be the shape of the holder of the proximity sensor according to the sixth modification based on the present embodiment and a light path of the outgoing light of the light emitting device guided in the cylindrical light guide. Although only a part of the outgoing light from the light emitting device is shown in FIG. 9 for ease of understanding, the light is actually radially emitted from the light emitting device.

As shown in FIG. 9, the proximity sensor according to the sixth modification is different in the shape of a holder 40G from proximity sensor 1A in the above-described present embodiment. Specifically, holder 40G includes a reflective portion 45 in addition to fixed portion 41, closing portion 42, cylindrical light guide 43, and cord retainer 44 as described above. Reflective portion 45 is a flat plate member which extends toward circuit board 30 continuously from closing portion 42 and serves to reflect, among the light emitted from light emitting device 32, the light emitted along the axial direction of case body 10 in the forward direction, thereby efficiently collecting the light at the second light emitting surface. It is to be noted that the shape of cylindrical light guide 43 is the same as that of the cylindrical light guide described in any of the present embodiment and its first to fifth modifications as described above.

The configuration as described above allows a greater amount of light emitted from light emitting device 32 to be efficiently collected at the second light emitting surface, so that the second light emitting surface emits light more sufficiently. Accordingly, when the configuration as in the sixth modification is applied, not only the effects can be achieved which are similar to those achieved in the case of proximity sensor 1A in the above-described present embodiment, but also the indication state of light emitting device 32 can be observed from outside with good visibility.

Second Embodiment

Figure 10:
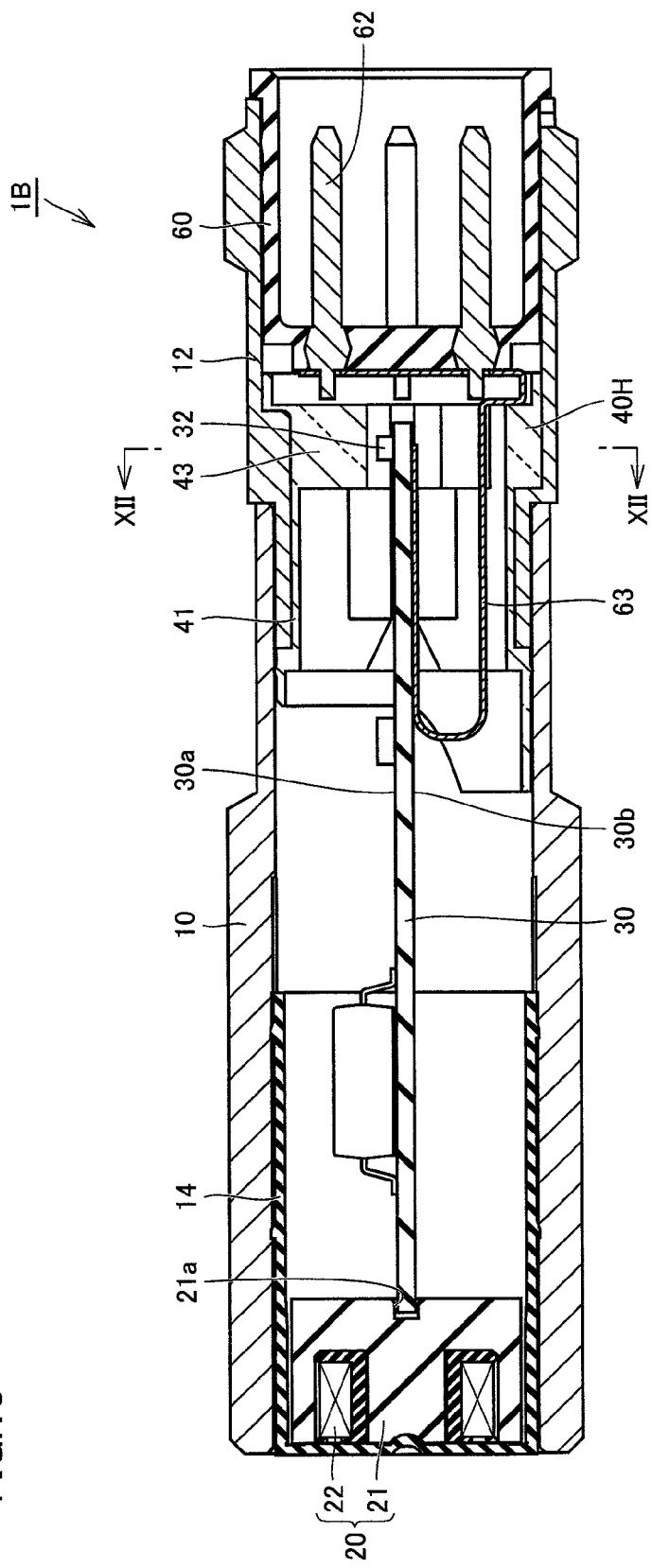
FIG. 10 is a schematic cross sectional view showing the internal structure of the proximity sensor in the second embodiment of the present invention.
Figure 11:
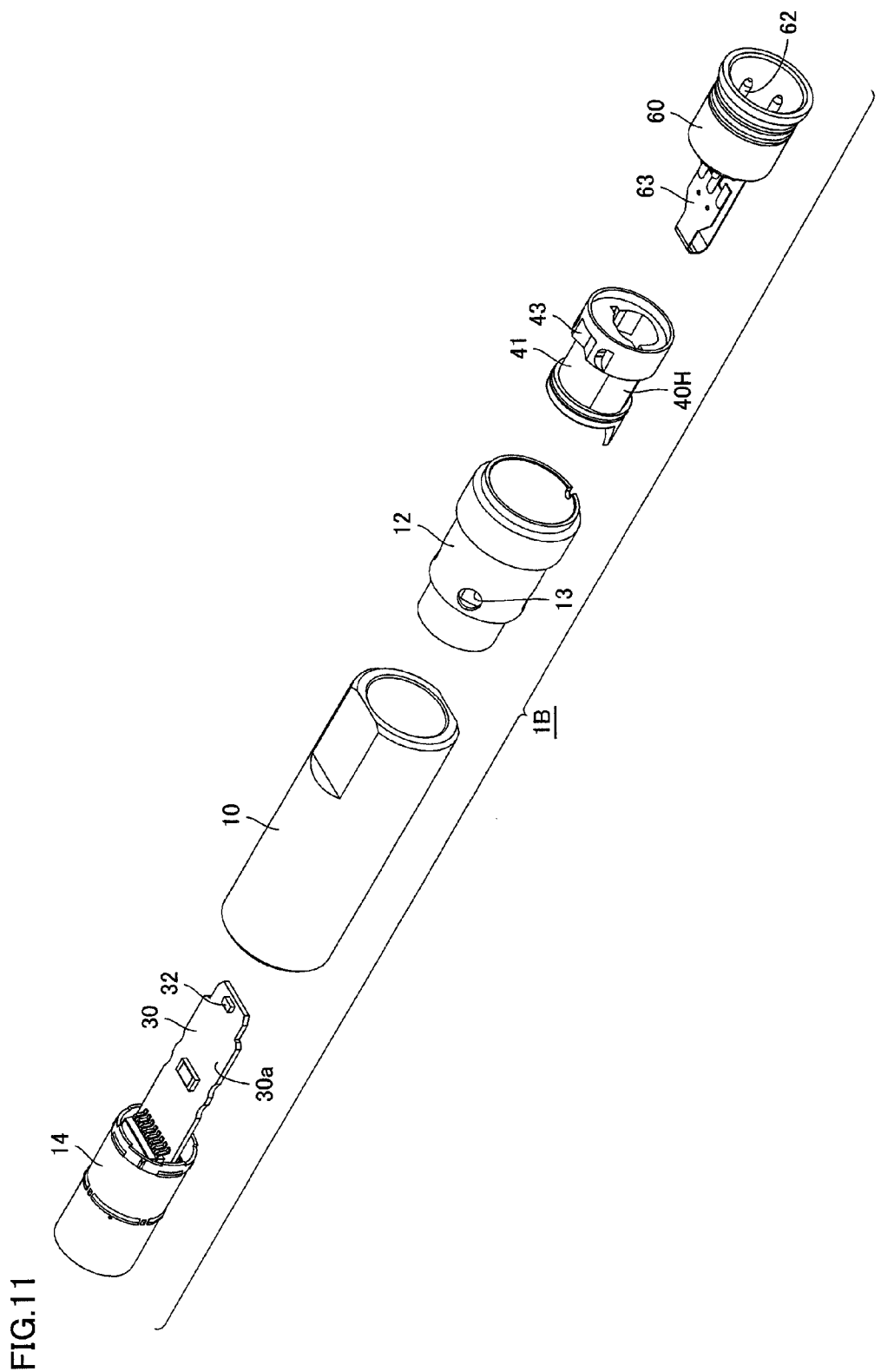
FIG. 11 is an exploded perspective view showing the assembly structure of the proximity sensor shown in FIG. 10.

FIG. 10 is a schematic cross sectional view of the internal structure of the proximity sensor in the second embodiment of the present invention. Furthermore, FIG. 11 is an exploded perspective view showing the assembly structure of the proximity sensor shown in FIG. 10. First, referring to FIGS. 10 and 11, the structure of the proximity sensor according to the present embodiment will be described. It is to be noted that the same components as those in the proximity sensor in the above-described first embodiment are designated by the same reference characters, and description thereof will not be repeated.

As shown in FIGS. 10 and 11, a proximity sensor 1B in the present embodiment having an approximately cylindrical outer shape mainly includes a case body 10 and a holder case 12 each as a housing, a coil assembly 20, a circuit board 30, a holder 40H as a fixing member, a receptacle 60, a terminal pin 62, and a flexible wiring board 63.

Case body 10 forming a housing is similar to case body 10 in the above-described first embodiment and has a light blocking effect. Holder case 12 forming a housing together with case body 10 is made of a metal cylindrical member having both ends opened. Holder case 12 also has a front end and a rear end in the axial direction. The front end of holder case 12 is inserted into the rear end of case body 10 and fixedly press-fitted therein. It is to be noted that holder case 12 has a light blocking effect as with case body 10.

Coil assembly 20 and circuit board 30 each have the same configuration as those in the above-described first embodiment. In other words, coil assembly 20 has core 21 and detecting coil 22, and is disposed at the front end within case body 10. Circuit board 30 is disposed behind coil assembly 20 so as to extend along the axial direction of case body 10 and includes a rear end having surface 30a on which light emitting device 32 is mounted.

A holder 40H having an approximately cylindrical shape is formed by injection molding of a light-transmitting resin material. Holder 40H includes fixed portion 41 and cylindrical light guide 43. Fixed portion 41 and cylindrical light guide 43 are inserted into the front end of holder case 12 and fixedly press-fitted therein. Cylindrical light guide 43 surrounds, along the circumferential direction of case body 10, the portion of circuit board 30 having light emitting device 32 mounted thereon.

Receptacle 60 is made of a cylindrical insulating member having a bottom and is fixedly press-fitted to the rear end of holder case 12. Receptacle 60 serves as a member for supporting terminal pin 62. Receptacle 60 has a bottom into which the portion at and around the end of terminal pin 62 is inserted, thereby supporting terminal pin 62. Terminal pin 62 corresponds to a connection for electrically connecting the output circuit and the power supply circuit provided in circuit board 30 to the outside.

Flexible wiring board 63 has one end connected to the end of terminal pin 62 and the other end connected to rear surface 30b of circuit board 30 through the space within holder 40H. It is to be noted that flexible wiring board 63 corresponds to a wiring board that is excellent in flexibility as compared with the above-described rigid wiring board and that is formed by attaching a conductor pattern with an adhesive and the like onto the main surface of the base material made of polyimide resin, for example. Since this flexible wiring board 63 has moderate flexibility, it can be freely bent or folded and can also be used as a wiring board for relaying between electric contacts.

In contrast to proximity sensor 1A in the above-described first embodiment, in proximity sensor 1B in the present embodiment, cylindrical light guide 43 of holder 40H is covered by light-blocking holder case 12. Accordingly, as shown in FIG. 11, a portion of holder case 12 covering cylindrical light guide 43 is provided with a plurality of windows 13 so as to allow the light emitted from light emitting device 32 to be emitted to outside. Four windows 13 are provided at almost regular intervals along the circumferential direction of holder case 12.

Figure 12:
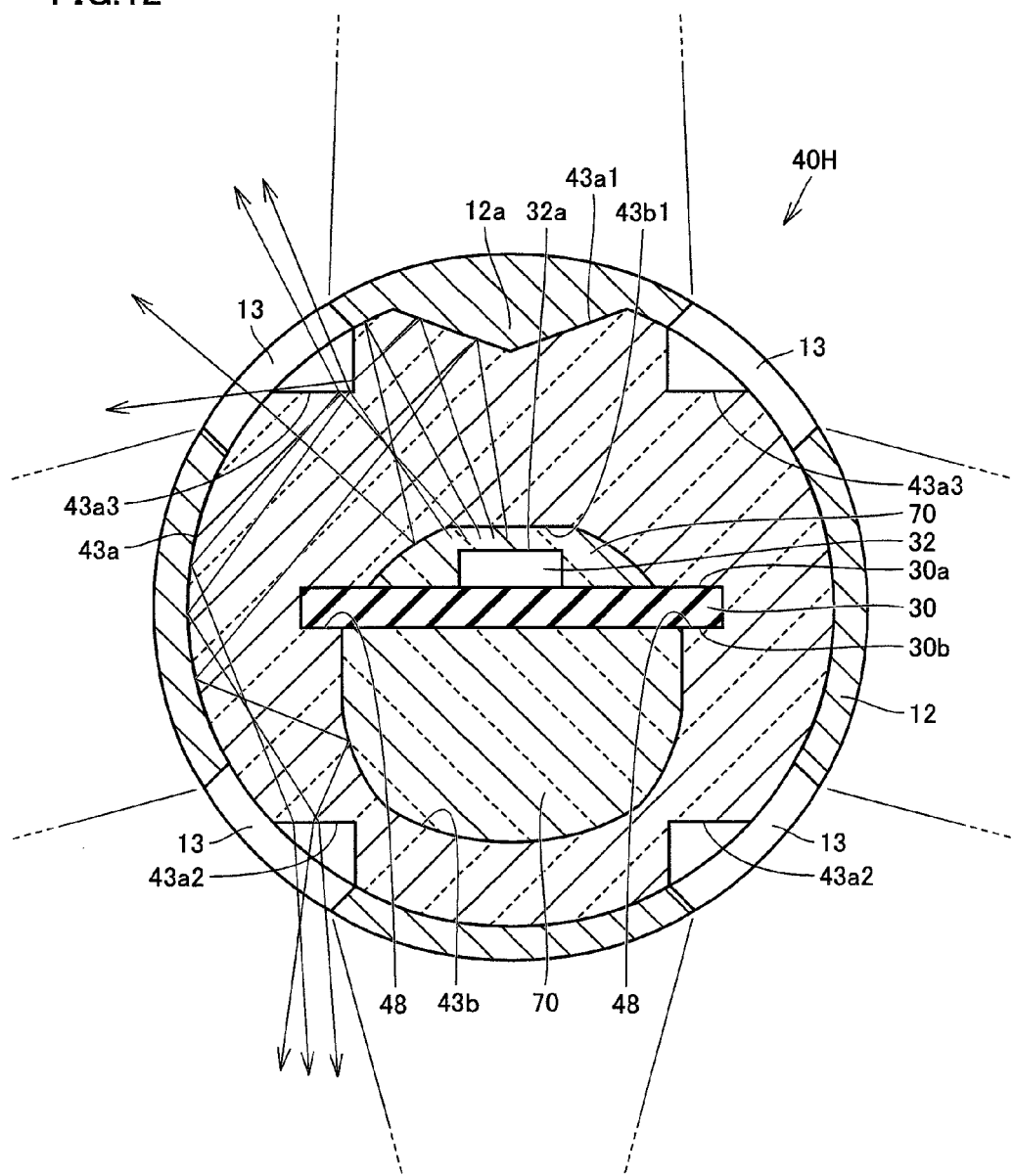
FIG. 12 is a schematic cross sectional view showing the shape of the cylindrical light guide of the proximity sensor shown in FIG. 10.

FIG. 12 is a cross sectional view of the proximity sensor taken along a line XII-XII shown in FIG. 10 and is a schematic cross sectional view showing the shape of the holder case as a housing and the shape of the cylindrical light guide of the holder as a fixing member. Then, referring to FIG. 3, described in detail will be the shape of the holder case, the shape of the cylindrical light guide and the light path of the outgoing light of the light emitting device that is guided in the cylindrical light guide. Although only a part of the light emitted from the light emitting device is shown in FIG. 12 for ease of understanding, the light is actually radially emitted from the light emitting device.

As shown in FIG. 12, holder case 12 having an approximately cylindrical shape has an inner space into which holder 40H is fixedly press-fitted. Cylindrical light guide 43 of holder 40H having an approximately cylindrical shape includes outer circumferential surface 43a and inner circumferential surface 43b. Most part of outer circumferential surface 43a of cylindrical light guide 43 is in contact with the inner circumferential surface of holder case 12. In the predetermined position of inner circumferential surface 43b of cylindrical light guide 43, a pair of support grooves 48 is provided for supporting circuit board 30. The pair of support grooves 48 supports both side ends of circuit board 30 for supporting circuit board 30 with holder 40H. Light emitting device 32 is mounted on a portion of surface 30a of circuit board 30 surrounded by cylindrical light guide 43 of holder 40H. Furthermore, the space within cylindrical light guide 43 is filled with light-transmitting resin sealing layer 70, so that light emitting device 32 is sealed in resin sealing layer 70.

It is to be noted that holder 40H can be attached to holder case 12 by integral molding using a molding machine in addition to press-fitting fixation as described above. In other words, when a molding machine is used for molding holder 40H integrally with holder case 12, holder case 12 is fixed in the molding die which is then placed in the molding machine to perform injection-molding of holder 40H. This results in formation of holder 40H integrally with holder case 12.

Furthermore, it is preferable that resin sealing layer 70 is configured to have a thin film. This is because the light emitted from light emitting device 32 is propagated through cylindrical light guide 43, and also because resin sealing layer 70 made of a thick film causes an increase in the reflection number and re-incident of the light on resin sealing layer 70, which leads to an increase in light propagation loss, with the result that the amount of light emitted to outside is decreased. Accordingly, resin sealing layer 70 is formed to have a thin film while sufficiently ensuring the thickness of cylindrical light guide 43, which allows stabilized light propagation. Consequently, the amount of light emitted to the outside can be satisfactorily ensured. In this case, it is preferable that resin sealing layer 70 formed as a thin film is configured to have a thickness enough to prevent any influence from being exerted on the performance of light emitting device 32 and to allow light emitting device 32 to be provided with an appropriate environment resistance (for example, oil resistance, water resistance, moisture resistance or the like). Specifically, it is preferable that the thickness is 5 μm or more and 20 μm or less.

In a portion of inner circumferential surface 43b of cylindrical light guide 43 located above light outgoing surface 32a of light emitting device 32, a flat region is provided, thereby forming refractive surface 43b1. Furthermore, in a portion of outer circumferential surface 43a of cylindrical light guide 43 located above light emitting device 32, a V-shaped groove in cross section is formed, so that a pair of flat regions is provided which is arranged at an angle with respect to each other. This leads to formation of a pair of reflective surfaces 43a1. Furthermore, in a portion of outer circumferential surface 43a of cylindrical light guide 43 which covers surface 30a of circuit board 30 having light emitting device 32 mounted thereon but excludes the portion having the above-described pair of reflective surfaces 43a1 provided therein, a V-shaped groove in cross section is formed which is different from the above-described groove, to thereby provide a pair of flat regions arranged at an angle with respect to each other. One of the pair of flat regions provides a reflective surface 43a3. The groove described above is formed in each of portions of outer circumferential surface 43a corresponding to both sides of light emitting device 32, which leads to formation of two reflective surfaces 43a3. Refractive surface 43b1, the pair of reflective surfaces 43a1 and the pair of reflective surfaces 43a3 serve to refract and reflect a part of the light emitted from light outgoing surface 32a of light emitting device 32 within cylindrical light guide 43 in the circumferential direction. These surfaces each are provided in a portion of cylindrical light guide 43 covering surface 30a of circuit board 30 on which light emitting device 32 is mounted. In addition, in a portion of the inner circumferential surface of holder case 12 corresponding to the portion where the above-described pair of reflective surfaces 43a1 is provided, a V-shaped protrusion 12a in cross section is provided so as to fit into the V-shaped groove in cross section.

The above-described reflective surface 43a3 and the portions of outer circumferential surface 43a of cylindrical light guide 43 located on both sides of reflective surface 43a3 function as the first light emitting surface. This first light emitting surface serves to emit the light to the outside when a part of the light emitted from light emitting device 32 passes through cylindrical light guide 43. Two first light emitting surfaces are provided based on the number of reflective surfaces 43a3. In this case, the planes of outer circumferential surface 43a of cylindrical light guide 43 located on both sides of reflective surface 43a3 include a plane located adjacent to reflective surface 43a1 which corresponds to one flat region of the pair of reflective surfaces 43a3. Furthermore, holder case 12 is provided with a window 13 in a portion where the first light emitting surface including this reflective surface 43a3 is located, in which case two windows 13 are provided based on the number of the first light emitting surfaces. This causes the light passing through the first light emitting surface to be emitted through these two windows 13 to the outside.

Furthermore, in the predetermined position of outer circumferential surface 43a of cylindrical light guide 43 located in the portion blocked by circuit board 30 as seen from light emitting device 32, a V-shaped groove in cross section is formed, so that a pair of flat regions is provided which is arranged at an angle with respect to each other. One of the pair of flat regions provides a second light emitting surface 43a2. The above-described groove is formed below circuit board 30 and in the vicinity of each of both side ends of circuit board 30, to thereby provide two second light emitting surfaces 43a2. Each second light emitting surface 43a2 faces in the direction different from that of the above-described first light emitting surface. These two second light emitting surfaces 43a2 serve to emit the light to the outside when a part of the light emitted from light emitting device 32 is guided through cylindrical light guide 43 and passed through these two second light emitting surfaces 43a2. Also, holder case 12 is provided with a window 13 located in the position where each second light emitting surface 43a2 is provided, in which case two windows 13 are provided based on the number of second light emitting surfaces 43a2. This causes the light passing through the second light emitting surface to be emitted through these two windows 13 to the outside.

In proximity sensor 1B according to the present embodiment, a part of the light emitted from light emitting device 32 is refracted and reflected on refractive surface 43b1, the pair of reflective surfaces 43a1 and the pair of reflective surfaces 43a3 described above to cause the light to be guided through cylindrical light guide 43 in the circumferential direction. The light is further reflected on outer circumferential surface 43a of cylindrical light guide 43 and thereby collected at the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light.

As described above, according to proximity sensor 1B in the present embodiment, even in the case where only a single light emitting device 32 is mounted on surface 30a of circuit board 30, the light emitted from this single light emitting device 32 can be sufficiently emitted omnidirectionally in the simplified configuration in which only a flat region is provided in each of outer circumferential surface 43a and inner circumferential surface 43b of cylindrical light guide 43 of holder 40H and only window 13 is provided in a portion of holder case 12 corresponding to cylindrical light guide 43. Since the above-described flat region can be readily formed during the injection molding of holder 40H and the above-described window 13 can be readily formed during formation of holder case 12, an increase in the manufacturing cost can be suppressed. Therefore, by applying the above-described configuration, a proximity sensor manufactured at low cost can be achieved which allows the indication state of light emitting device 32 to be observed from outside with good visibility.

In addition, proximity sensor 1B in the present embodiment is configured such that protrusion 12a is provided in the inner circumferential surface of holder case 12 so as to fit into the V-shaped groove in cross section formed in order to provide a pair of reflective surfaces 43a1 in outer circumferential surface 43a of cylindrical light guide 43 of holder 40H. The above-described configuration allows the groove and protrusion 12a to perform a positioning function when holder 40H is fixedly press-fitted into holder case 12. Therefore, positioning by the groove and protrusion 12a allows positioning of the first light emitting surface, second light emitting surface 43a2 and window 13 in the circumferential direction with considerable ease.

Furthermore, by applying the configuration similar to that of proximity sensor 1B in the present embodiment, even in the case where the distance between circuit board 30 and outer circumferential surface 43a is relatively short (that is, the portion of cylindrical light guide 43 facing light emitting device 32 is thin in thickness), the amount of light emitted from the first light emitting surface and the second light emitting surface can be adjusted by adjusting the angle of each of reflective surface 43a1 and reflective surface 43a3. Consequently, the proximity sensor can be configured in a relatively small size.

Figure 13:
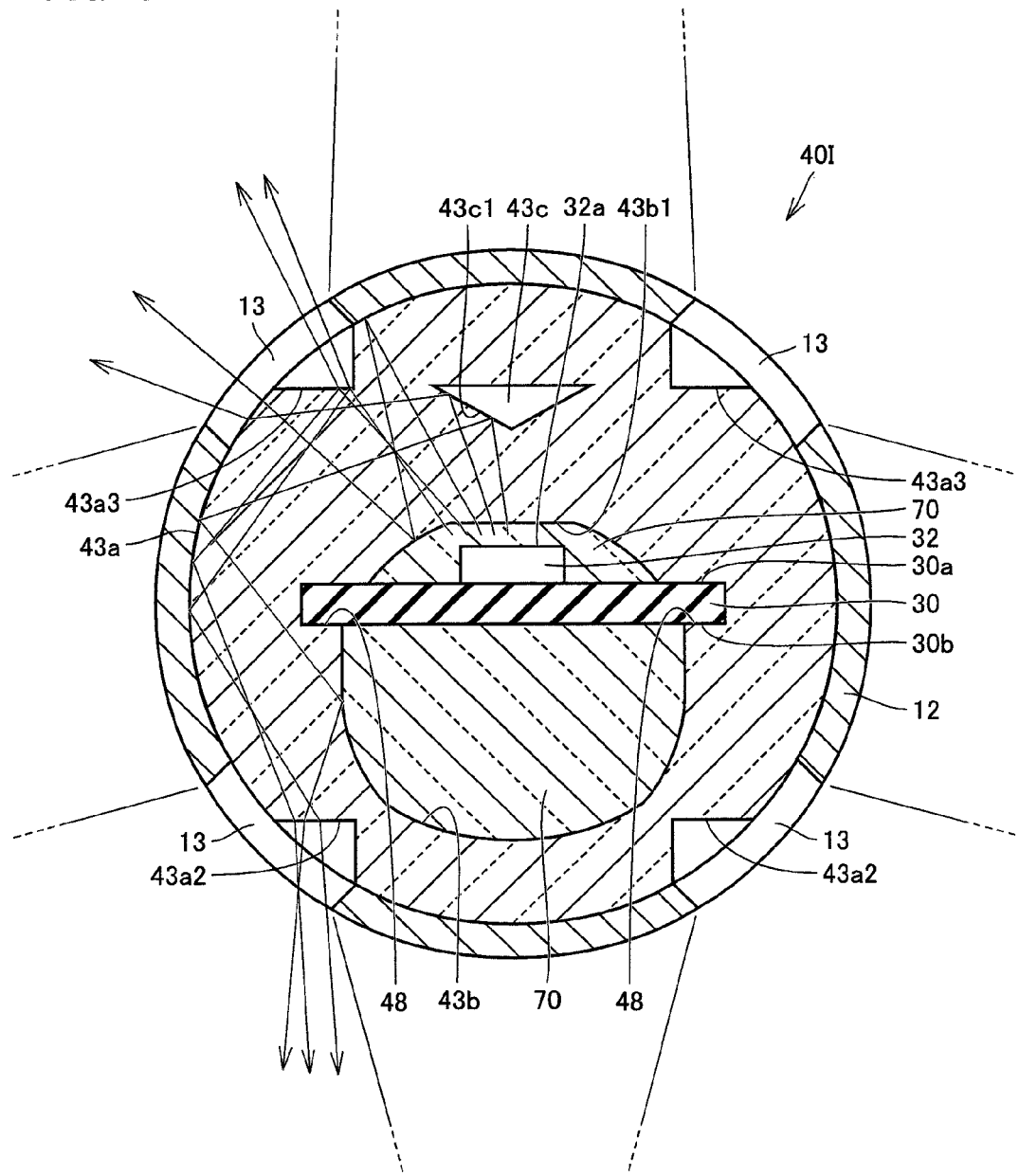
FIG. 13 is a schematic cross sectional view showing the shape of the cylindrical light guide of the proximity sensor according to the modification of the second embodiment of the present invention.

FIG. 13 is a schematic cross sectional view showing the shape of the cylindrical light guide of the proximity sensor according to the modification based on the present embodiment. Then, referring to FIG. 13, described will be the shape of the holder case of the proximity sensor according to the modification of the present embodiment, the shape of the cylindrical light guide and the light path of the outgoing light from the light emitting device that is guided in the cylindrical light guide. Although only a part of the outgoing light from the light emitting device is shown in FIG. 13 for ease of understanding, the light is actually radially emitted from the light emitting device.

As shown in FIG. 13, in the proximity sensor according to the present modification, the shape of holder case 12 and the shape of cylindrical light guide 43 of a holder 40I are different from those of proximity sensor 1B in the above-described present embodiment in that, specifically, protrusion 12a as described above is not provided in the inner circumferential surface of holder case 12 and also in the configuration of a part of the reflective surface provided in cylindrical light guide 43. Other components are identical in shape. In particular, the differences of the configuration of the reflective surface will be hereinafter described in detail.

In proximity sensor 1B according to the above-described present embodiment, a pair of reflective surfaces 43a1 is formed by providing a V-shaped groove in cross section in outer circumferential surface 43a of cylindrical light guide 43. In contrast, in the proximity sensor according to the present modification, a pair of reflective surfaces 43c1 is formed by providing hollow 43c in a portion of cylindrical light guide 43 located above light emitting device 32. More specifically, cylindrical light guide 43 has planes defining hollow 43c, one of which is located adjacent to light emitting device 32 and has a V-shaped groove in cross section formed therein, so that a pair of flat regions is provided which is arranged at an angle with respect to each other. This leads to formation of a pair of reflective surfaces 43c1. The pair of reflective surfaces 43c1 serves to reflect the light emitted from light outgoing surface 32a of light emitting device 32 through cylindrical light guide 43 in the circumferential direction. The pair of reflective surfaces 43c1 is provided in a portion of cylindrical light guide 43 covering surface 30a of circuit board 30 having light emitting device 32 mounted thereon.

Also in the configuration as described above, a part of the light emitted from light emitting device 32 is refracted and reflected on refractive surface 43b1, the pair of reflective surfaces 43c1 and the pair of reflective surfaces 43a3 described above, to cause the light to be guided through cylindrical light guide 43 in the circumferential direction. The light is further reflected on outer circumferential surface 43a of cylindrical light guide 43 and thereby collected at the pair of second light emitting surfaces 43a2. Consequently, most of the light emitted from light emitting device 32 is efficiently collected at each of the pair of second light emitting surfaces 43a2, with the result that second light emitting surfaces 43a2 sufficiently emit light. Therefore, also in the case where the configuration as in the present modification is applied, the effects can be achieved which are similar to those achieved in the case where proximity sensor 1B in the above-described present embodiment is applied.

Although the first and second embodiments according to the present invention and their modifications as explained above have been described by illustrating the case where a cylindrical light guide is formed of a part of the holder as a fixing member, the configuration is not necessarily limited thereto, but a cylindrical light guide may be formed separately from a fixing member.

Furthermore, the first and second embodiments according to the present invention and their modifications as explained above have been described by illustrating the case where a flat region is formed by providing a V-shaped groove in cross section in the outer circumferential surface and/or inner circumferential surface of the cylindrical light guide and this flat region provides each of a reflective surface and a refractive surface. However, the reflective surface and refractive surface are not necessarily a flat plane but may be formed so as to have a curved surface.

Furthermore, the first and second embodiments according to the present invention and their modifications as explained above have been described by illustrating the case where a reflective surface, a refractive surface and a light emitting surface are formed simultaneously with the injection molding of the cylindrical light guide. However, the reflective surface, the refractive surface and the light emitting surface are not necessarily formed simultaneously with the injection molding of the cylindrical light guide, but may be formed by injection-molding of a cylindrical member serving as a cylindrical light guide which is then subjected to cutting processing.

Furthermore, the first and second embodiments according to the present invention and their modifications as explained above have been described by illustrating the case where the space within the cylindrical light guide is completely filled with the resin sealing layer. However, the configuration is not necessarily limited thereto, but the space may be partly or entirely left.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A proximity sensor detecting presence or absence of a metal body or a position of the metal body using a magnetic field, said proximity sensor comprising:
    a light-blocking housing having an elongated cylindrical shape and including a frond end and a rear end in an axial direction;
    a detecting coil located at the front end within said housing;
    a circuit board in a shape of a flat plate, said circuit board being provided with a processing circuit electrically connected to said detecting coil and disposed behind said detecting coil so as to extend along the axial direction of said housing;
    a light emitting device mounted on one of main surfaces of said circuit board and emitting light in accordance with an operation state; and
    a light-transmitting cylindrical light guide surrounding, along a circumferential direction of said housing, a portion of said circuit board having said light emitting device mounted thereon, said cylindrical light guide guiding outgoing light from said light emitting device to be emitted to outside, said cylindrical light guide including a first light outgoing region causing the light emitted from said light emitting device to pass therethrough and directly emitting the light to outside, a reflective surface reflecting the light emitted from said light emitting device to guide the light through said cylindrical light guide in the circumferential direction, and a second light outgoing region emitting, to outside, the light reflected on said reflective surface and propagated through said cylindrical light guide, wherein said first light outgoing region is provided in a portion of an outer circumferential surface of said cylindrical light guide covering said one of the main surfaces of said circuit board on which said light emitting device is mounted, and wherein said second light outgoing region is provided in a portion of the outer circumferential surface of said cylindrical light guide blocked by said circuit board as seen from said light emitting device.

2. The proximity sensor according to claim 1, wherein said reflective surface is formed by providing a flat region in an outer circumferential surface of said cylindrical light guide.

3. The proximity sensor according to claim 1, wherein said reflective surface is formed by providing a V-shaped groove in cross section in an outer circumferential surface of said cylindrical light guide.

4. The proximity sensor according to claim 1, wherein said reflective surface is formed by providing a hollow within said cylindrical light guide.

5. The proximity sensor according to claim 1, wherein said cylindrical light guide further includes a refractive surface refracting the light emitted from said light emitting device to guide the light through said cylindrical light guide in the circumferential direction.

6. The proximity sensor according to claim 5, wherein said refractive surface is formed by providing a flat region in an inner circumferential surface of said cylindrical light guide.

7. The proximity sensor according to claim 5, wherein said refractive surface is formed by providing a V-shaped groove in cross section in an inner circumferential surface of said cylindrical light guide.

8. The proximity sensor according to claim 1, wherein said first light outgoing region and said second light outgoing region each are formed by providing a flat region in an outer circumferential surface of said cylindrical light guide.

9. The proximity sensor according to claim 1, wherein said first light outgoing region and said second light outgoing region each are formed by providing a V-shaped groove in cross section in an outer circumferential surface of said cylindrical light guide.

10. The proximity sensor according to claim 1, wherein said cylindrical light guide is exposed at a position rearwardly of the rear end of said housing.

11. The proximity sensor according to claim 1, wherein said cylindrical light guide is covered by said housing, and
a window for exposing each of said first light outgoing region and said second light outgoing region is provided in a portion of said housing corresponding to each of said first light outgoing region and said second light outgoing region provided in said cylindrical light guide.

12. The proximity sensor according to claim 1, further comprising a light-transmitting resin sealing layer filling a space within said cylindrical light guide, wherein
said light emitting device is sealed in said resin sealing layer.

13. The proximity sensor according to claim 1, further comprising a fixing member supporting said circuit board and fixing said circuit board to said housing by at least a part of said fixing member attached to the rear end of said housing, wherein
said cylindrical light guide is formed of a part of said fixing member.

* * * * *